(12) United States Patent
Hsieh et al.

(10) Patent No.: US 11,787,332 B2
(45) Date of Patent: Oct. 17, 2023

(54) LIGHT-EMITTING DEVICE AND VEHICLE LAMP MODULE

(71) Applicant: Lite-On Technology Corporation, Taipei (TW)

(72) Inventors: Kai Yu Hsieh, Taipei (TW); Chih Chiang Kao, Taipei (TW); Cheng Ying Lee, Taipei (TW); Tsung Lin Lu, Taipei (TW)

(73) Assignee: Lite-On Technology Corporation, Taipei (TW)

( * ) Notice: Subject to any disclaimer, the term of this patent is extended or adjusted under 35 U.S.C. 154(b) by 73 days.

(21) Appl. No.: 17/549,886

(22) Filed: Dec. 14, 2021

(65) Prior Publication Data
US 2022/0242305 A1   Aug. 4, 2022

Related U.S. Application Data

(60) Provisional application No. 63/144,962, filed on Feb. 2, 2021.

(30) Foreign Application Priority Data

Nov. 1, 2021 (CN) .......................... 202111289457.5

(51) Int. Cl.
| | |
|---|---|
| *H01L 33/38* | (2010.01) |
| *H01L 33/56* | (2010.01) |
| *H01L 33/62* | (2010.01) |
| *B60Q 1/30* | (2006.01) |
| *F21S 43/14* | (2018.01) |
| *B60Q 1/26* | (2006.01) |

(Continued)

(52) U.S. Cl.
CPC ............. *B60Q 1/30* (2013.01); *B60Q 1/2607* (2013.01); *B60Q 1/44* (2013.01); *F21S 43/14* (2018.01); *F21S 43/255* (2018.01); *F21V 9/30* (2018.02); *H01L 25/13* (2013.01); *H01L 33/10* (2013.01); *H01L 33/382* (2013.01); *H01L 33/56* (2013.01); *H01L 33/62* (2013.01); *F21Y 2115/10* (2016.08)

(58) Field of Classification Search
CPC ... F21K 9/62; F21K 9/64; H01L 33/52; H01L 33/54; H01L 33/56
See application file for complete search history.

(56) References Cited

U.S. PATENT DOCUMENTS

| | | | |
|---|---|---|---|
| 8,760,049 B2 * | 6/2014 | Cha ...................... | G02B 6/0068 313/512 |
| 11,398,458 B2 * | 7/2022 | Soer .................... | H01L 25/0753 |

(Continued)

*Primary Examiner* — Eric T Eide
(74) *Attorney, Agent, or Firm* — JCIPRNET

(57) ABSTRACT

A light-emitting device includes a substrate including circuit pads and a resin portion. A frame disposed on the substrate to form a first space, first to third light sources, and first and second encapsulants. The frame includes an outer wall and a first partition in the first space to form the first space as independent second and third spaces. A first and second light sources are disposed at the second space and provide first and second light beams respectively. A third light source is disposed at the third space and provides a third light beam. A first encapsulant is filled at the second space to seal the first and second light sources. A second encapsulant is filled at the third space to seal the third light source. The second encapsulant includes a first wavelength conversion material converting the third light beam into a fourth light beam.

13 Claims, 16 Drawing Sheets

(51) Int. Cl.
  *F21S 43/20*   (2018.01)
  *B60Q 1/44*    (2006.01)
  *H01L 25/13*   (2006.01)
  *F21V 9/30*    (2018.01)
  *H01L 33/10*   (2010.01)
  *F21Y 115/10*  (2016.01)

(56) References Cited

U.S. PATENT DOCUMENTS

| 2013/0094179 | A1* | 4/2013 | Dai | F21V 3/02 |
| | | | | 362/84 |
| 2015/0260357 | A1* | 9/2015 | Liaw | F21K 9/62 |
| | | | | 362/231 |
| 2019/0234581 | A1* | 8/2019 | Iwakura | H01L 33/502 |
| 2020/0381596 | A1* | 12/2020 | Choi | H01L 33/504 |

* cited by examiner

LIGHT-EMITTING DEVICE AND VEHICLE LAMP MODULE

CROSS-REFERENCE TO RELATED APPLICATION

This application claims the priority benefit of U.S. application Ser. No. 63/144,962, filed on Feb. 2, 2021, and China application serial no. 202111289457.5, filed on Nov. 1, 2021. The entirety of each of the above-mentioned patent applications is hereby incorporated by reference herein and made a part of this specification.

BACKGROUND OF THE INVENTION

Field of the Invention

The invention relates to an optical device, and particularly relates to a light-emitting device and a vehicle lamp module.

Description of Related Art

A vehicle lamp module, in particular a vehicle tail lamp module, generally includes a white warning light, an orange direction light, and a red brake light. However, in the current trend, the design of the vehicle lamp module is gradually moving towards a fully red shell design. Therefore, how to make the light appear white or orange after passing through the fully red shell is an object of research in the art.

In addition, because different manufacturers adopt different types of red shells, designing a luminous source that can adapt to all kind of red shells will be an even more substantial development.

SUMMARY OF THE INVENTION

The invention provides a light-emitting device and a vehicle lamp module that may obtain the CIE color point in compliance with vehicle regulations (JIS D5500) via the control of a control element to match all kind of the red translucent protective shells with different thicknesses.

The invention provides a light-emitting device including a substrate, a frame, a first light source, a second light source, a third light source, a first encapsulant, and a second encapsulant. The substrate includes a plurality of circuit pads and a resin portion connected to the plurality of circuit pads. The frame is disposed on the substrate to form a first space. The frame includes an outer wall and a first partition located in the first space to form the first space as a second space and a third space spaced apart from each other. The first light source is disposed at the second space and configured to provide a first light beam. The second light source is disposed at the second space and configured to provide a second light beam. The third light source is disposed at the third space and configured to provide a third light beam. The first encapsulant is filled at the second space to seal the first light source and the second light source. The second encapsulant is filled at the third space to seal the third light source, wherein the second encapsulant includes a first wavelength conversion material configured to convert the third light beam into a fourth light beam.

The invention also provides a vehicle lamp module including a light-emitting device, a red translucent protective shell, and a control element. The light-emitting device is configured to provide an internal light beam. The light-emitting device includes a substrate, a frame, a first light source, a second light source, a third light source, a first encapsulant, and a second encapsulant. The substrate includes a plurality of circuit pads and a resin portion connected to the plurality of circuit pads. The frame is disposed on the substrate to form a first space. The frame includes an outer wall and a first partition located in the first space to form the first space as a second space and a third space spaced apart from each other. The first light source is disposed at the second space and configured to provide a first light beam. The second light source is disposed at the second space and configured to provide a second light beam. The third light source is disposed at the third space and configured to provide a third light beam. The first encapsulant is filled at the second space to seal the first light source and the second light source. The second encapsulant is filled at the third space to seal the third light source, wherein the second encapsulant includes a first wavelength conversion material configured to convert the third light beam into a fourth light beam. The red translucent protective shell is disposed on a transmission path of the internal light beam. The control element is electrically connected to the light-emitting device and configured to control a luminous intensity of the first light beam, the second light beam, and the third light beam, so that after at least one or a plurality of the light beams passes through the red translucent protective shell, the vehicle lamp module emits an external light beam of a white light, an orange light, or a red light.

Based on the above, in the light-emitting device and the vehicle lamp module of the invention, the frame of the light-emitting device includes an outer wall and a first partition to form at least two separate spaces. Therefore, via the light beam provided by the first light source, the light beam provided by the second light source, and the light beam provided by the third light source in combination with the first wavelength conversion material, an internal light beam with mixed wavelengths may be formed and transmitted to the red translucent protective shell, and then pass through the red translucent protective shell to form an external light beam in compliance with vehicle regulations. In this way, vehicle light beams of different wavelengths in compliance with vehicle regulations may be adjusted by the control of a control element, and the vehicle light beams of different wavelengths, the light-emitting device of the present invention may adapt to all kinds of red translucent protective shells with different thicknesses.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
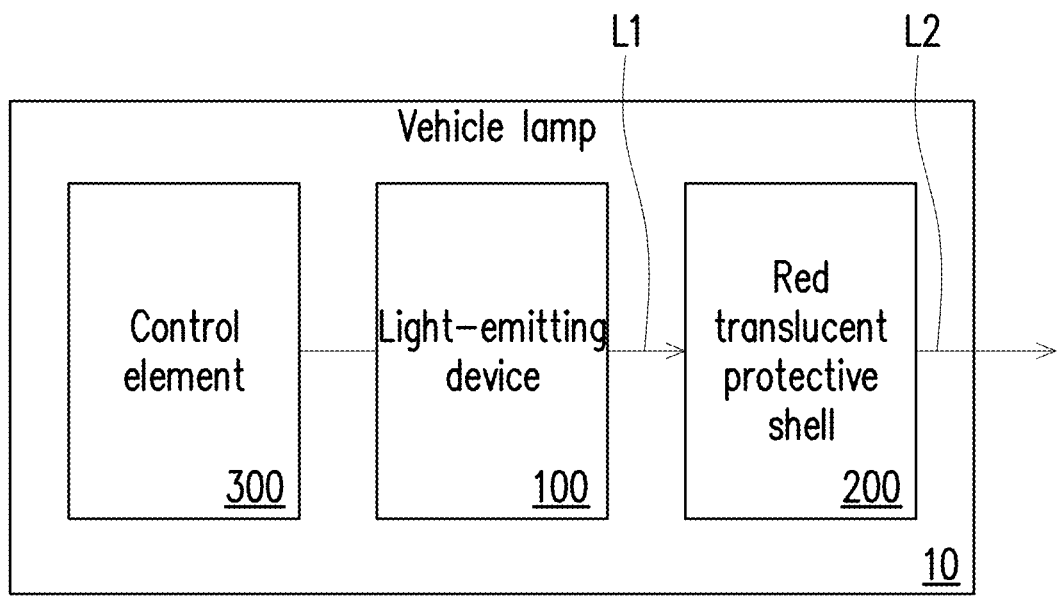
FIG. 1 is a schematic diagram of an implementation aspect of a vehicle lamp module of the invention.

FIG. 1 is a schematic diagram of an implementation aspect of a vehicle lamp module of the invention. Please refer to FIG. 1. The present implementation aspect provides a vehicle lamp module 10 including a light-emitting device 100, a red translucent protective shell 200, and a control element 300. The light-emitting device 100 is configured to provide an internal light beam L1, and the red translucent protective shell 200 is disposed on the transmission path of the internal light beam L1. The control element 300 is electrically connected to the light-emitting device 100 and configured to adjust the electrical parameters of the light-emitting device 100, so that after the internal light beam L1 provided by the light-emitting device 100 passes through the red translucent protective shell 200, the vehicle lamp module 10 may emit an external light beam L2 of white light, orange light, or red light as the vehicle light.

Figure 2:
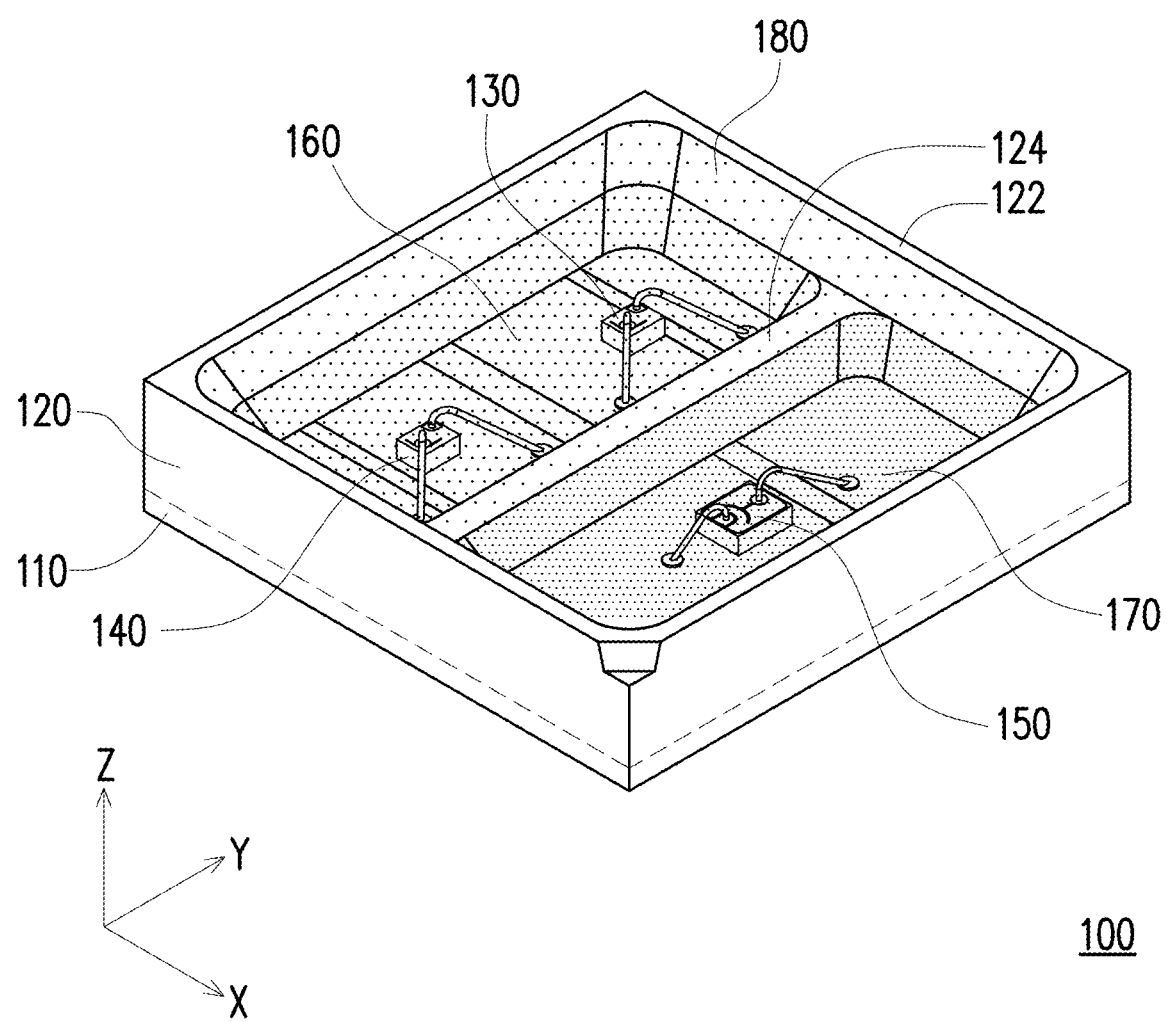
FIG. 2 is a stereoscopic schematic diagram of the first implementation aspect of a light-emitting device of the invention.
Figure 3:
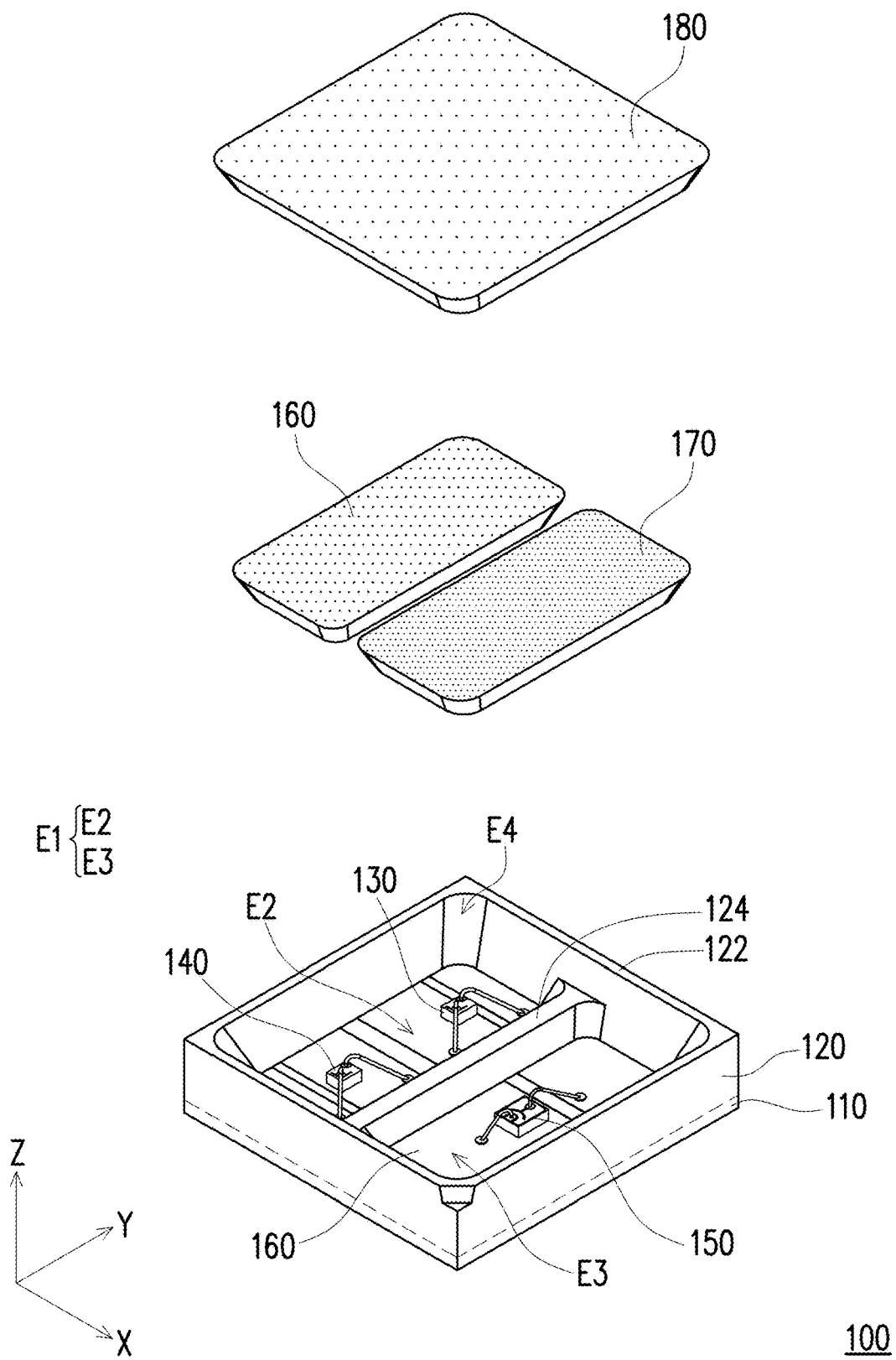
FIG. 3 is a stereoscopic exploded schematic diagram of the light-emitting device of FIG. 2.
Figure 4:
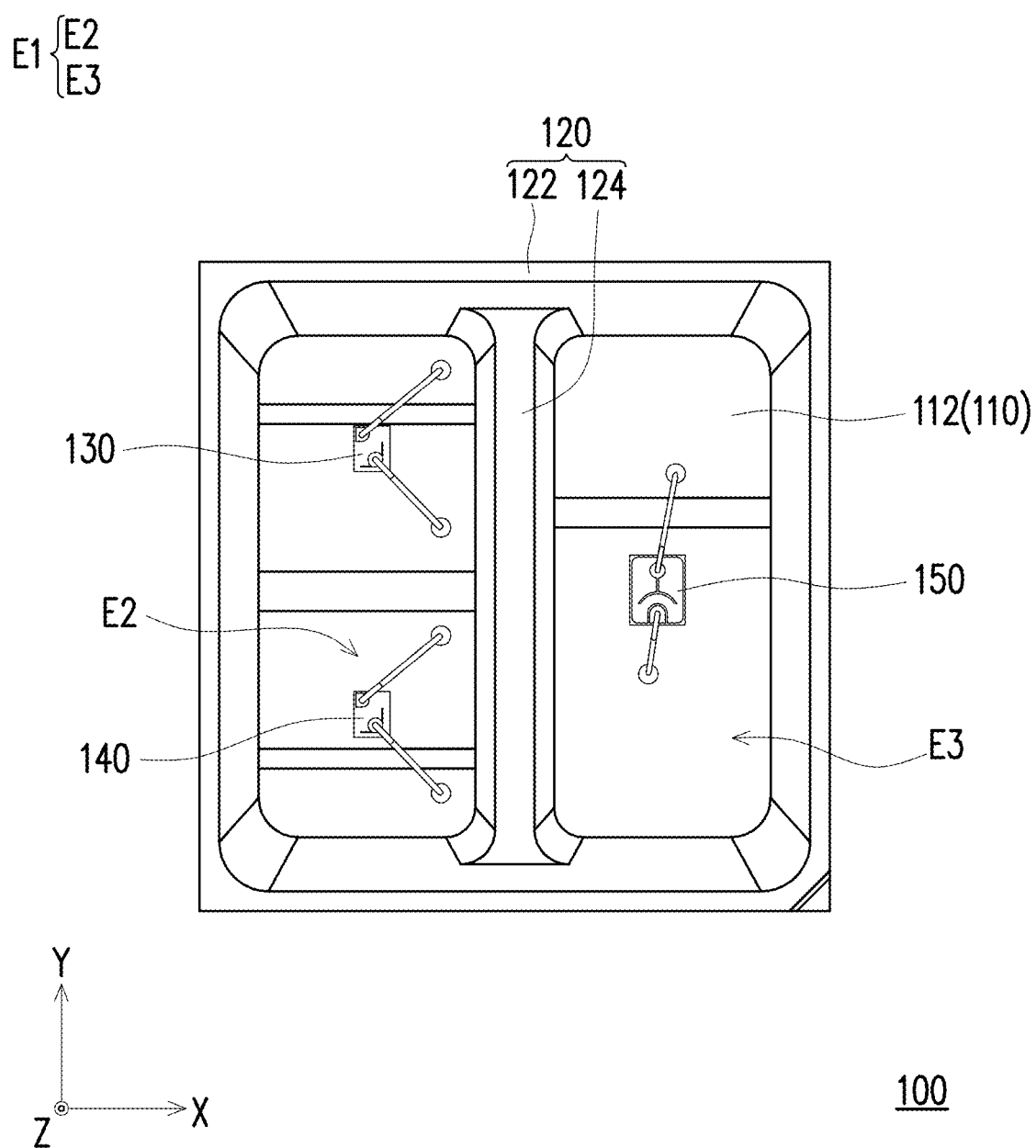
FIG. 4 is a schematic top view of the light-emitting device of FIG. 2.
Figure 5:
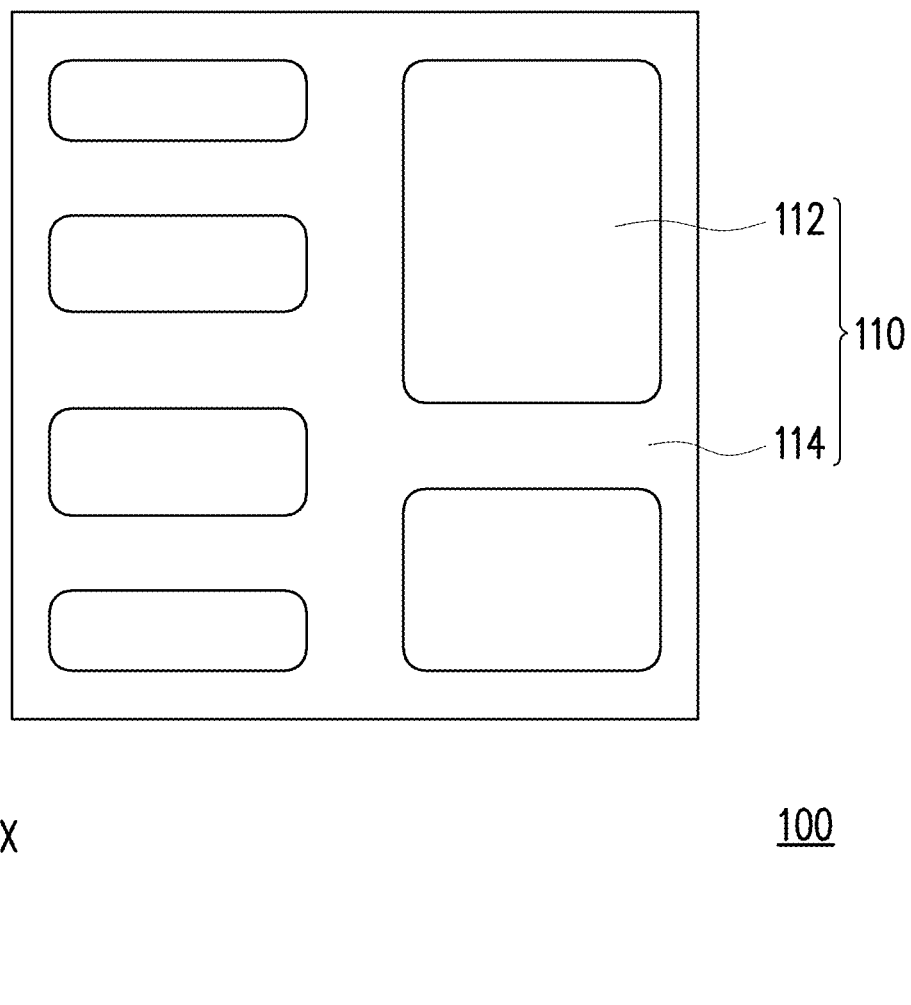
FIG. 5 is a schematic bottom view of the light-emitting device of FIG. 2.

FIG. 2 is a stereoscopic schematic diagram of the first implementation aspect of a light-emitting device of the invention. FIG. 3 is a stereoscopic exploded schematic diagram of the light-emitting device of FIG. 2. FIG. 4 is a schematic top view of the light-emitting device of FIG. 2. FIG. 5 is a schematic bottom view of the light-emitting device of FIG. 2. Please refer to FIG. 2 to FIG. 5. In particular, FIG. 4 omits showing the encapsulant. In the present embodiment, the light-emitting device 100 includes a substrate 110, a frame 120, a first light source 130, a second light source 140, a third light source 150, a first encapsulant 160, and a second encapsulant 170. The substrate 110 is, for example, a circuit board, and includes a plurality of circuit pads 112 and a resin portion 114 connected to the plurality of circuit pads 112, wherein the plurality of circuit pads 112 are configured to connect the first light source 130, the second light source 140, and the third light source 150, and the frame 120 is, for example, a structure configured to construct a plurality of accommodating spaces. The frame 120 is disposed on the substrate 110 to form a first space E1. The frame 120 includes an outer wall 122 and a first partition 124. The first partition 124 is located in the first space E1 to form the first space E1 as a second space E2 and a third space E3 spaced apart from each other, as shown in FIG. 3 and FIG. 4. It should be mentioned that, in the embodiment shown in FIG. 1, the substrate 110 (for example, the resin portion 114) and the frame 120 are integrally formed, but the invention is not limited thereto. The substrate 110 and the frame 120 may also be two independent members.

The first light source 130 is disposed at the substrate 110 and located at the second space E2 and configured to provide a first light beam. The second light source 140 is disposed at the substrate 110 and located at the second space E2 and configured to provide a second light beam. The third light source 150 is disposed at the substrate 110 and located at the third space E3 and configured to provide a third light beam. In particular, the first light source 130, the second light source 140, and the third light source 150 are respectively connected to different circuit pads 112, so that the first light source 130, the second light source 140, and the third light source 150 are electrically independent of each other. In other words, the first light source 130 and the second light source 140 are disposed in the same space and are separated from the third light source 150. The first light source 130, the second light source 140, and the third light source 150 are electrically independent of each other and may be driven independently. Specifically, in the present embodiment, both the first light source 130 and the third light source 150 are blue light-emitting diodes, and therefore respectively provide a blue first light beam and third light beam, and the second light source 140 is a green light-emitting diode, and therefore provides a green second light beam. Moreover, the resin portion 114 integrally formed with the frame 120 separates the circuit pads 112 to form different circuit regions, and the first light source 130 to the third light source 150 are respectively disposed at different circuit regions to facilitate subsequent electrical connection with the control element 300 respectively, as shown in FIG. 5.

The first encapsulant 160 is filled at the second space E2 to seal the first light source 130 and the second light source 140. Specifically, the first encapsulant 160 is a translucent resin, and silicone resin is selected in some embodiments. The second encapsulant 170 is filled at the third space E3 to seal the third light source 150. In particular, the first encapsulant 170 is a translucent resin, and silicone resin is selected in some embodiments. In the present embodiment, the second encapsulant 170 contains a first wavelength conversion material configured to convert the third light beam into a fourth light beam. Specifically, the first wavelength conversion material preferably contains red or orange phosphor. Therefore, the blue third light beam may be converted into a red or orange fourth light beam after passing through the second encapsulant 170. It should be mentioned that, since the second space E2 and the third space E3 are separated from each other, the first encapsulant 160 and the second encapsulant 170 are not overlapped in the light-emitting direction of the light-emitting device 100 (i.e., the positive Z direction).

In addition, the height of the first partition 124 is less than the height of the outer wall 122, so that the space above the first partition 124 may be used for other purposes. Specifically, in the present embodiment, the frame 120 also includes a fourth space E4 therein located above the first partition 124. That is, the fourth space E4 is overlapped with the first space E1 (or overlapped with the first encapsulant 160 and the second encapsulant 170) in the light-emitting direction of the light-emitting device 100 (i.e., the positive Z direction). The light-emitting device 100 further includes a third encapsulant 180 filled at the fourth space E4 and covering the first encapsulant 160 and the second encapsulant 170. The third encapsulant 180 contains a translucent resin, and preferably includes a diffusion particle. The diffusion particle includes, for example, titanium dioxide, silicon dioxide, zirconium dioxide, boron nitride, etc., configured to diffuse the first light beam, the second light beam, the fourth light beam, and the fifth light beam described later. Specifically, in some embodiments, the third encapsulant 180 is a combination of translucent silicone resin and titanium dioxide.

Therefore, under the configuration of the present implementation aspect, via the blue first light beam provided by the first light source 130, the green second light beam provided by the second light source 140, and the orange or red fourth light beam provided by the third light source 150 in combination with the first wavelength conversion material, an internal light beam is formed by mixing and adjusting the ratio of each light beam. Then, the internal light beam is transmitted to the red translucent protective shell 200, and then passes through the red translucent protective shell 200 to form a light beam in compliance with vehicle regulations. Via this principle, the light intensity of each light beam in the light-emitting device 100 may be controlled via the control element 300 to obtain the light beam (that is, the external light beam L2) in compliance with vehicle regulations to adapt to all kinds of the red translucent protective shell 200 with different thicknesses.

Please refer further to FIG. 1 and FIG. 2. It is also worth mentioning that the vehicle lamp module 10 of the present implementation aspect further includes a sensing element (not shown) electrically connected to the control element 300. The sensing element is configured to receive a temperature signal to provide an adjustment signal to the control element 300. The control element 300 adjusts the first light source 130, the second light source 140, and the third light source 150 according to the adjustment signal. In this way, the power of the light source may be controlled according to the actual light beam intensity to prevent other factors such as temperature from affecting the luminous efficiency and color.

Figure 6:
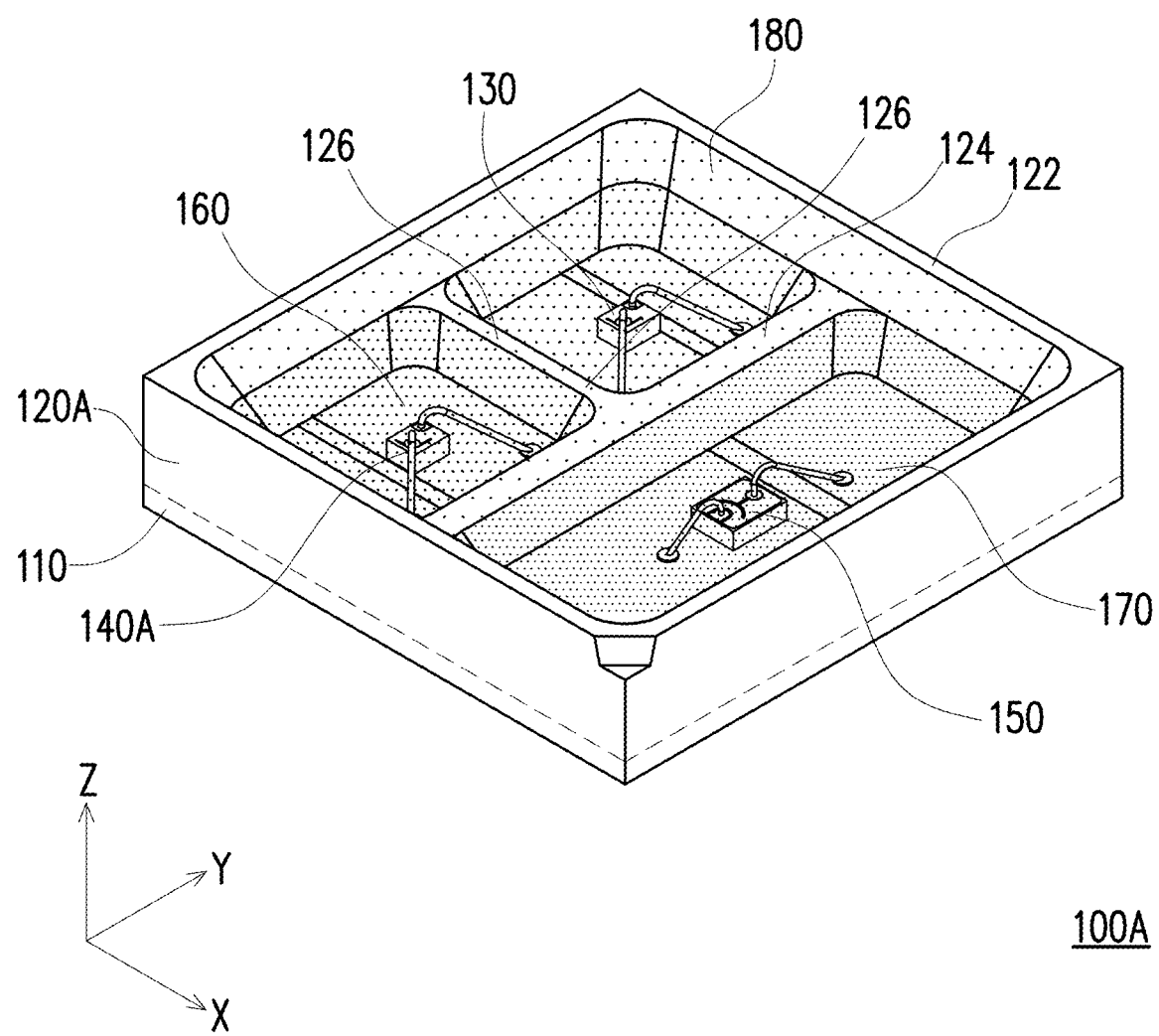
FIG. 6 is a stereoscopic schematic diagram of the second implementation aspect of a light-emitting device of the invention.
Figure 7:
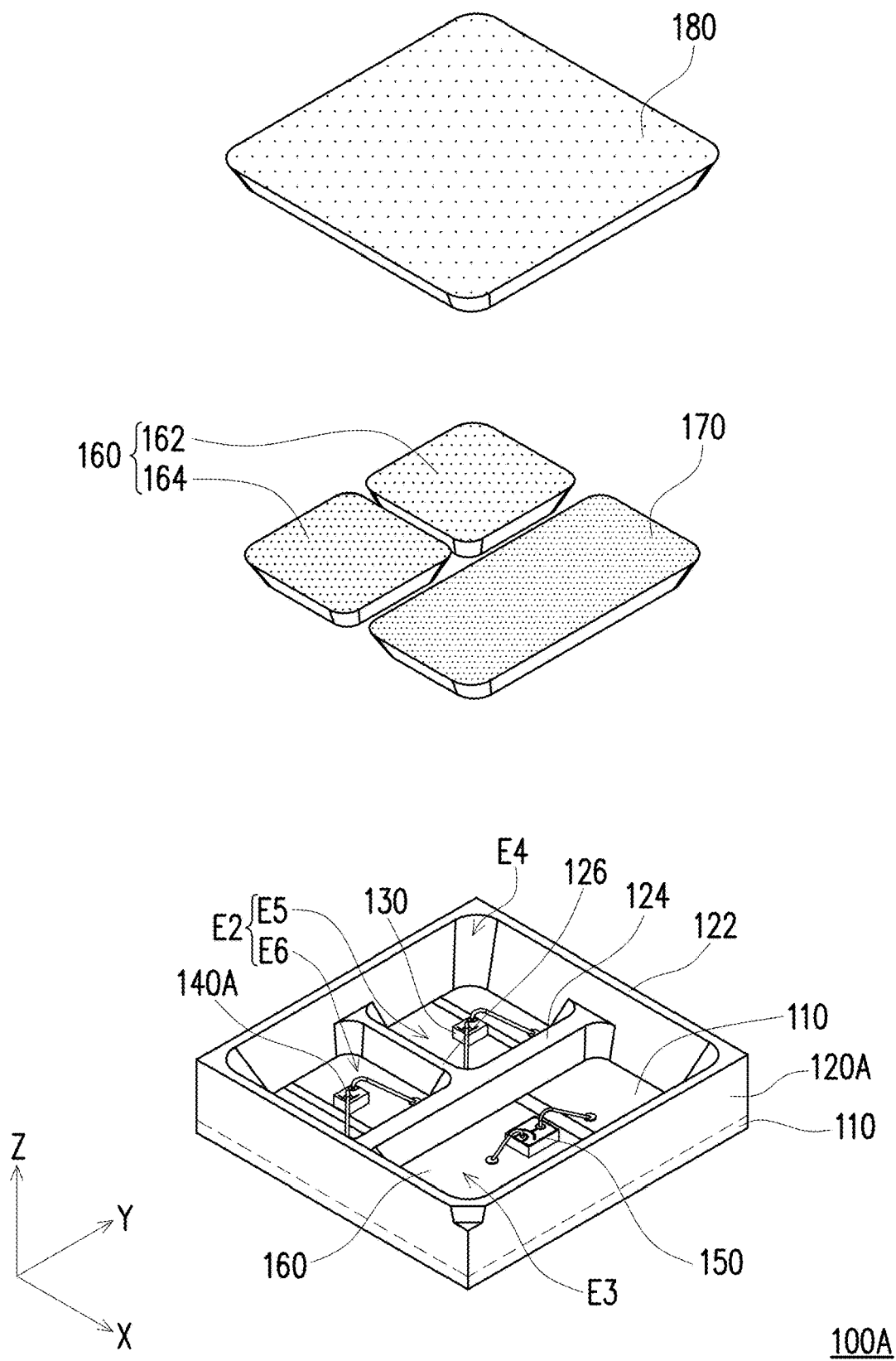
FIG. 7 is a stereoscopic exploded schematic diagram of the light-emitting device of FIG. 6.
Figure 8:
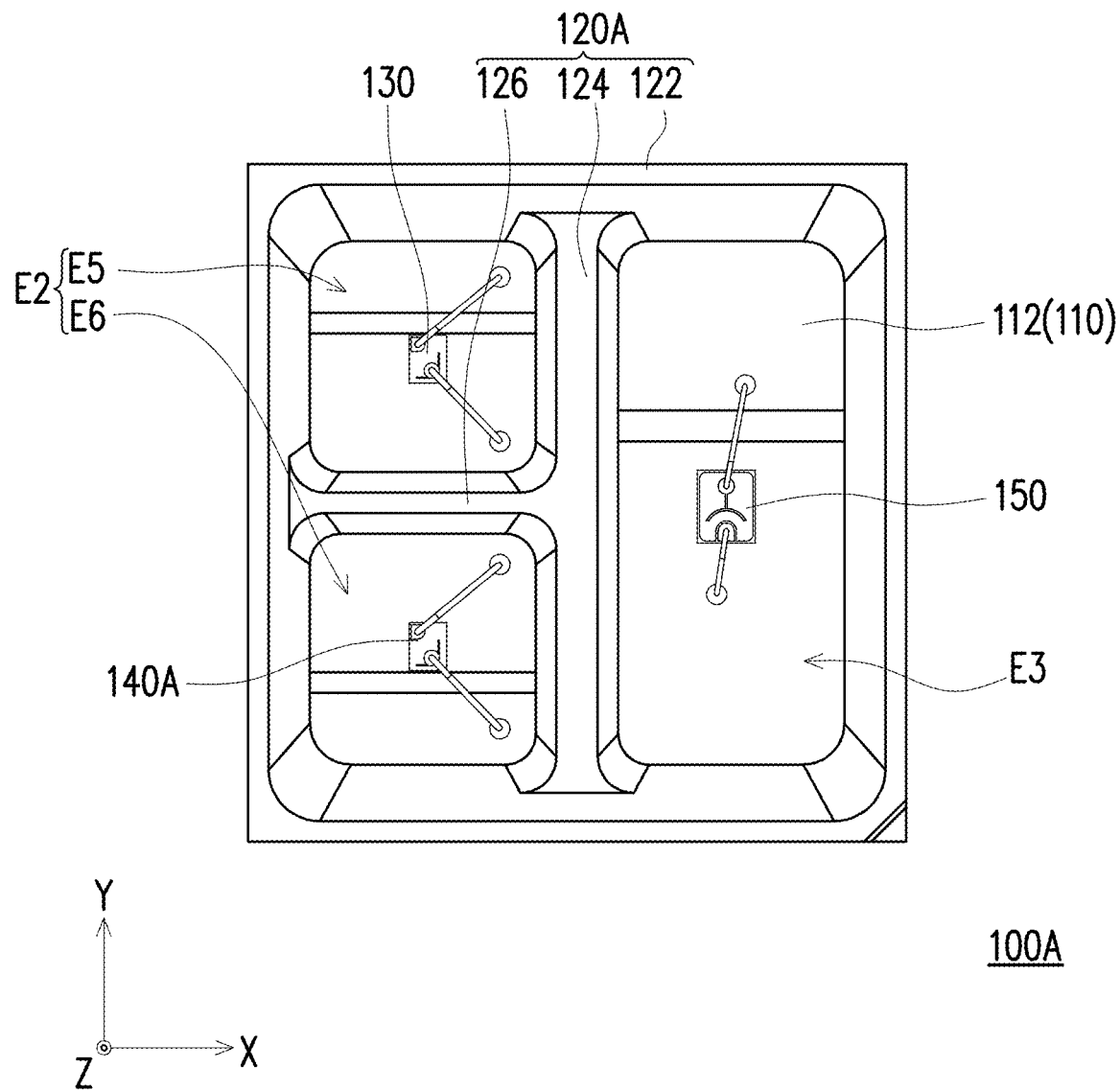
FIG. 8 is a schematic top view of the light-emitting device of FIG. 6.
Figure 9:
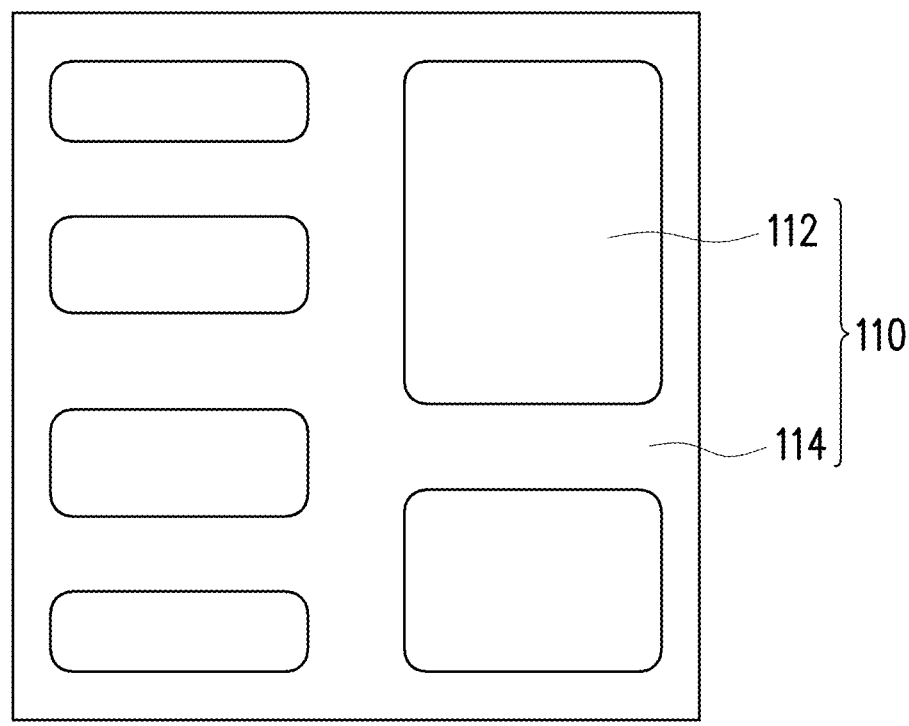
FIG. 9 is a schematic bottom view of the light-emitting device of FIG. 6.
Figure 9:
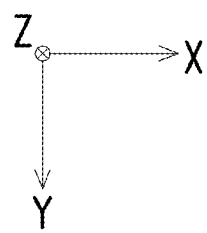

FIG. 6 is a stereoscopic schematic diagram of the second implementation aspect of a light-emitting device of the invention. FIG. 7 is a stereoscopic exploded schematic diagram of the light-emitting device of FIG. 6. FIG. 8 is a schematic top view of the light-emitting device of FIG. 6. FIG. 9 is a schematic bottom view of the light-emitting device of FIG. 6. Please refer to FIG. 6 to FIG. 9. In particular, FIG. 8 omits showing the encapsulant. A light-emitting device 100A of the present embodiment is similar to the light-emitting device 100 shown in FIG. 2. The difference between the two is that in the present embodiment, a frame 120A further includes a second partition 126 connected to the first partition 124. The second partition 126 is located in the second space E2 to form the second space E2 as a fifth space E5 and a sixth space E6 spaced apart from each other. The first light source 130 is disposed at the fifth space E5, and a second light source 140A is disposed at the sixth space E6.

In addition, in the present implementation aspect, the first light source 130 is a yellow light-emitting element, and the second light source 140A and the third light source 150 are both blue light-emitting elements. The first light source 130 is disposed at the substrate 110 and located at the fifth space E5 and configured to provide a blue first light beam. The second light source 140A is disposed at the substrate 110 and located at the sixth space E6 and configured to provide a blue second light beam. The third light source 150 is disposed at the substrate 110 and located at the third space E3 and configured to provide a blue third light beam. In other words, the first light source 130, the second light source 140A, and the third light source 150 are disposed in different spaces and are separated from each other.

Moreover, in the present implementation aspect, the first encapsulant 160 includes a first portion 162 and a second portion 164. The first portion 162 is filled at the fifth space E5 to seal the first light source 130, and the second portion 164 is filled at the sixth space E6 to seal the second light source 140A, wherein the second portion 164 includes a second wavelength conversion material configured to convert the second light beam into a fifth light beam. Specifically, the second portion 164 of the first encapsulant 160 may be a combination of translucent silicone resin and green phosphor. Therefore, the blue second light beam is transmitted and passes through the second portion 164 containing the second wavelength conversion material to be converted into a green fifth light beam. It should be mentioned that, since the fifth space E5 and the sixth space E6 are separated from each other, the first portion 162 and the second portion 164 of the first encapsulant 160 are not overlapped in the light-emitting direction (i.e., the positive Z direction) of the light-emitting device 100A.

Therefore, under the configuration of the present embodiment, via the yellow first light beam provided by the first light source 130, the green fifth light beam provided by the second light source 140A in combination with the second wavelength conversion material, and the orange or red fourth light beam provided by the third light source 150 in combination with the first wavelength conversion material, an internal light beam is formed by mixing and adjusting the ratio of each light beam. Then, the internal light beam is transmitted to the red translucent protective shell 200, and then passes through the red translucent protective shell 200 to form a light beam (i.e., the external light beam L2) in compliance with vehicle regulations. Via this principle, the light intensity of each light beam in the light-emitting device 100A may be controlled via the control element 300 to obtain the light beam in compliance with vehicle regulations.

The invention may adopt any wavelength conversion material commonly used in the industry. Inorganic phosphor is preferred, and a suitable inorganic phosphor is, for example, $(Ba,Sr)_2SiO_4:Eu^{2+}$, $BaMgAl_{10}O_{17}:Eu^{2+},Mn^{2+}$, $(Tb,Lu,Gd)_3(Al,Ga)_5O_{12}:Ce^{3+}$, $(Y,Lu,Gd)_3(Al,Ga)_5O_{12}:Ce^{3+}$, $(Na,K,Cs)_2(Si,Ti,Ge)F_6:Mn^{4+}$, $(Sr,Ca,Ba)_2Si_5N_8:Eu^{2+}$, $(Sr,Ca)SiAlN_3:Eu^{2+}$, $Sr_2Si_5N_8:Eu^{2+}$, $Si_{12-m-n}Al_{m+n}O_nN_{16-n}:Eu^{2+}$ (α-SiAlON), or $Si_{6-n}Al_nO_nN_{8-n}:Eu^{2+}$ (β-SiAlON).

In the invention, the spectrum of the required internal light beam may be obtained according to the transmission spectrum of the red translucent protective shell 200 and the white light spectrum required by laws and regulations. Moreover, the driving power of the first light source, the second light source, and the third light source may be adjusted according to the spectrum of the required internal light, thereby controlling the color and intensity of the first light beam, the second light beam, the fourth light beam, or the fifth light beam. In the following, a plurality of different embodiments are used to illustrate the means and effects of the invention.

Figure 10:
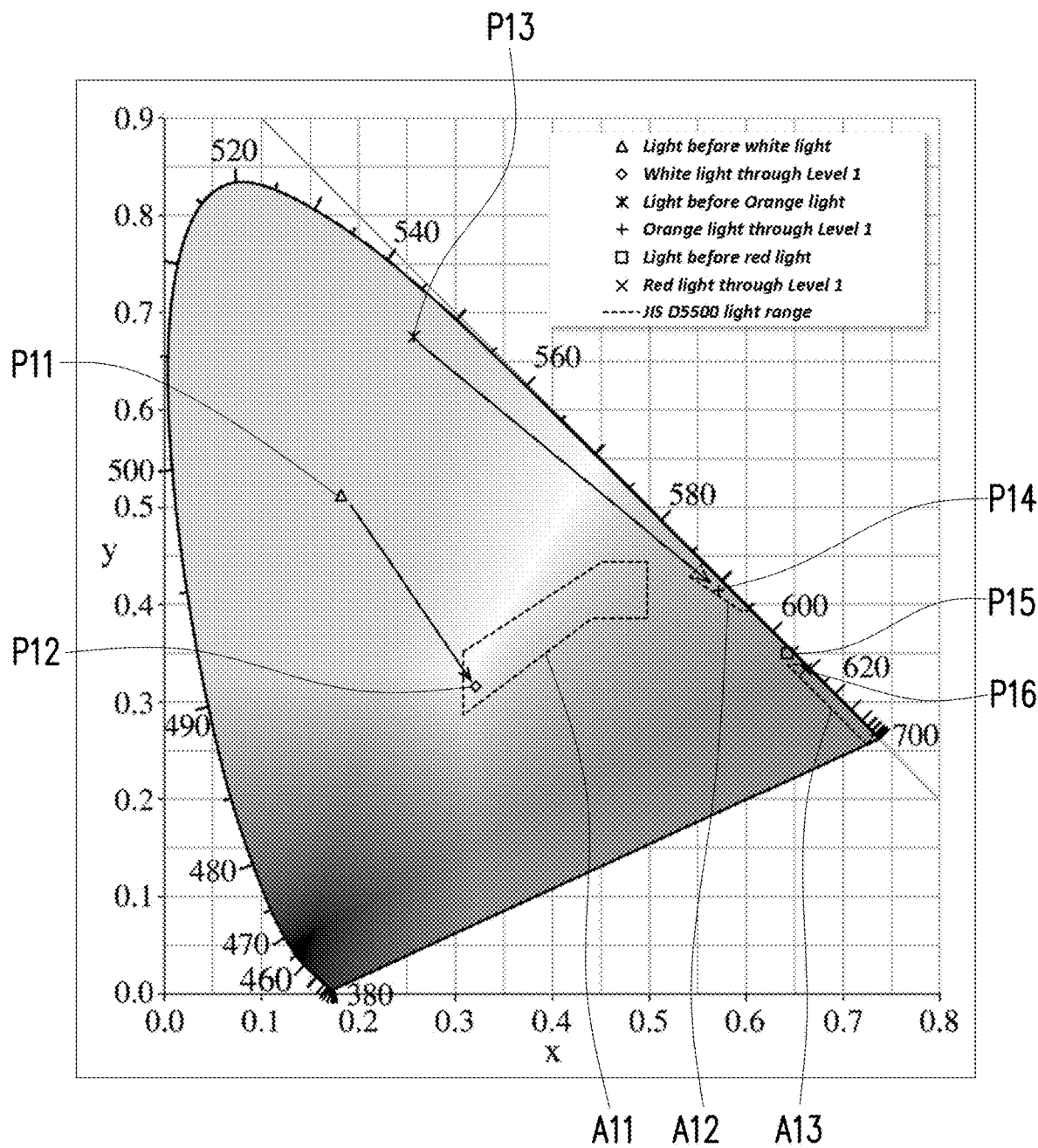
FIG. 10 is a chromaticity diagram of an embodiment in which the light-emitting device of FIG. 2 is applied to a vehicle lamp module.
Figure 11:
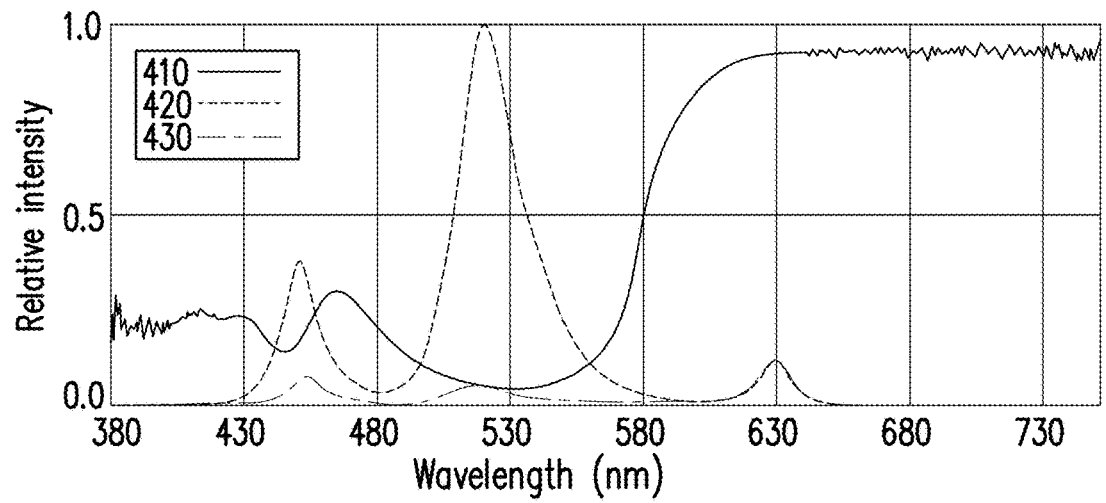
FIG. 11 is a spectral change diagram of white light formed by the internal light beam in the embodiment of FIG. 10 after passing through the red translucent protective shell.
Figure 12:
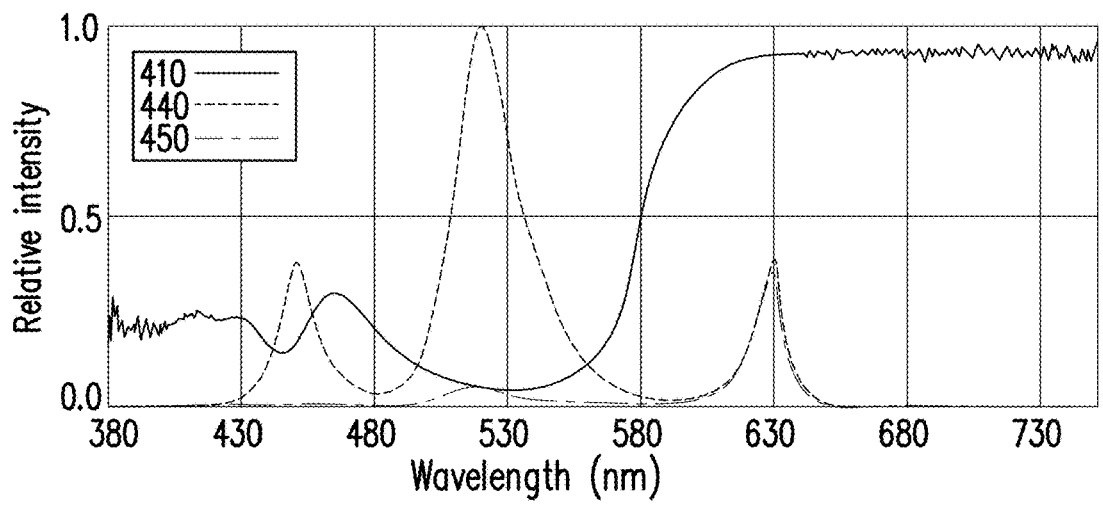
FIG. 12 is a spectral change diagram of orange light formed by the internal light beam in the embodiment of FIG. 10 after passing through the red translucent protective shell.
Figure 13:
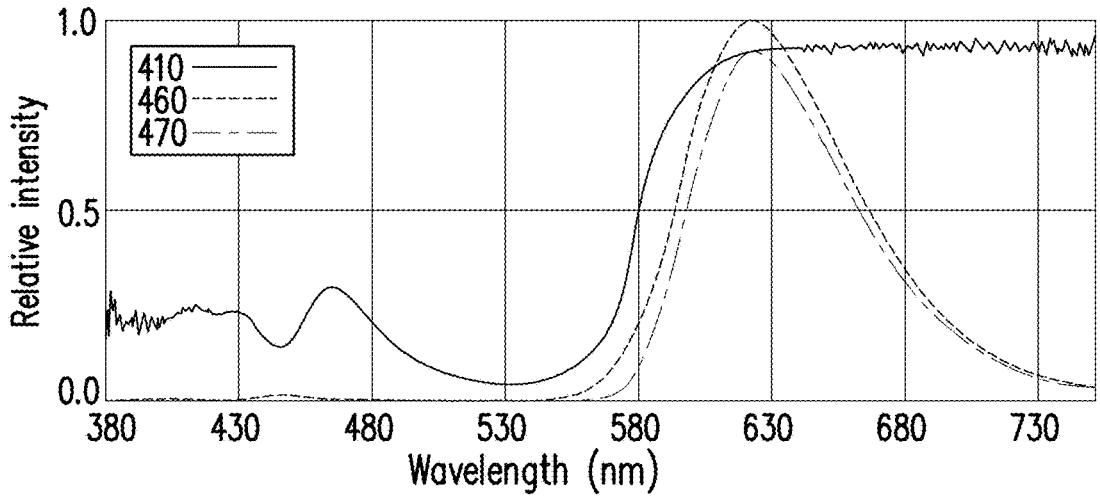
FIG. 13 is a spectral change diagram of red light formed by the internal light beam in the embodiment of FIG. 10 after passing through the red translucent protective shell.

In an embodiment of the vehicle lamp module 10, the vehicle lamp module 10 includes the light-emitting device 100 shown in FIG. 2 and the red translucent protective shell 200, wherein the thickness of the red translucent protective shell 200 is exemplified as 0.2 cm, and the first wavelength conversion material in the vehicle lamp module 10 is exemplified as $(Sr,Ca)SiAlN_3:Eu^{2+}$. FIG. 10 is a chromaticity diagram of the light-emitting device of FIG. 2 applied to the present embodiment of the vehicle lamp module. FIG. 11 is a spectral change diagram of white light formed by the internal light beam in the embodiment of FIG. 10 after passing through the red translucent protective shell. FIG. 12 is a spectral change diagram of orange light formed by the internal light beam in the embodiment of FIG. 10 after passing through the red translucent protective shell. FIG. 13 is a spectral change diagram of red light formed by the internal light beam in the embodiment of FIG. 10 after passing through the red translucent protective shell. Please first refer to FIG. 1, FIG. 2, FIG. 10, and FIG. 11. In FIG. 11, curve 410 represents the transmission spectrum of the red translucent protective cover 200, and curve 420 represents the spectrum of the internal light beam L1 provided by the light-emitting device 100, which corresponds to coordinate P11 in FIG. 10. Curve 430 represents the spectrum of the external light beam L2 after the internal light beam L1 passes through the red translucent protective shell 200, and corresponds to coordinate P12 in FIG. 10. This point falls within white block A11 of the vehicle regulations (JIS D5500). Therefore, when the white external light beam L2 in compliance with the vehicle regulations is to be provided, curve 420 may be calculated based on the data of curve 410 and curve 430 by means of simulation. Next, as shown in Table 2, the current ratio of the first light source 130, the second light source 140, and the third light source 150 is adjusted using the control element 300 to form a light source of curve 420.

Please refer to FIG. 1, FIG. 2, FIG. 10, and FIG. 12. In FIG. 12, curve 440 represents the spectrum of the internal light beam L1 provided by the light-emitting device 100, and corresponds to coordinate P13 in FIG. 10. Curve 450 represents the spectrum of the external light beam L2 after the internal light beam L1 passes through the red protective shell 200, and corresponds to coordinate P14 in FIG. 10. This point falls within orange block A12 of the vehicle regulations (JIS D5500). Similar to the above method of providing the external light beam L2 at coordinate P12, when the same red translucent protective shell 200 is used and the orange external light beam L2 in compliance with the vehicle regulations is to be provided, curve 440 may be obtained by calculating via the same method as described above, and as shown in Table 2, the current ratio of the first light source 130, the second light source 140, and the third light source 150 is adjusted using the control element 300 to form a light source of curve 440.

Please refer to FIG. 1, FIG. 2, FIG. 10, and FIG. 13. In FIG. 13, curve 460 represents the spectrum of the internal light beam L1 provided by the light-emitting device 100, and corresponds to coordinate P15 in FIG. 10. Curve 470 represents the spectrum of the external light beam L2 after the internal light beam L1 passes through the red translucent protective shell 200, and corresponds to coordinate P16 in FIG. 10. This point falls within red block A13 of the vehicle regulations (JIS D5500). Similar to the above method of providing the external light beam L2 at coordinate P12, when the same red translucent protective shell 200 is used and the red external light beam L2 in compliance with the vehicle regulations is to be provided, curve 460 may be obtained by calculating via the same method as described above, and as shown in Table 2, the current ratio of the first light source 130, the second light source 140, and the third light source 150 is adjusted using the control element 300 to form a light source of curve 460.

The detailed optical data and electrical data of the control output of the present embodiment may be seen in Table 1 and Table 2 below, respectively.

TABLE 1

| | Before passing through red translucent protective shell 200 | | |
|---|---|---|---|
| | Chromaticity x | Chromaticity y | Energy [W/nm] |
| P11 | 0.1831 | 0.5086 | 0.0088 |
| P13 | 0.2588 | 0.6706 | 0.0059 |
| P15 | 0.6453 | 0.3463 | 0.1898 |

| | After passing through red translucent protective shell 200 | | |
|---|---|---|---|
| | Chromaticity x | Chromaticity y | Energy [W/nm] |
| P12 (white light) | 0.3230 | 0.3124 | 0.0012 |
| P14 (orange light) | 0.5746 | 0.4107 | 0.0012 |
| P16 (red light) | 0.6643 | 0.3304 | 0.1650 |

| | Amount of change before and after passing through red translucent protective shell 200 | | |
|---|---|---|---|
| | Chromaticity Δx | Chromaticity Δy | ΔEnergy [W/nm] |
| P11→P12 | 0.1399 | −0.1962 | 13.60% |
| P13→P14 | 0.3158 | −0.2599 | 21.10% |
| P15→P16 | 0.0190 | −0.0159 | 86.97% |

TABLE 2

| | Light source current ratio distribution | | |
|---|---|---|---|
| | First light source 130 (producing blue light) | Second light source 140 (producing green light) | Third light source 150 (producing red light after passing through phosphor) |
| P11 | 1.6 | 12 | 1 |
| P13 | 0 | 8 | 2 |
| P15 | 0 | 0 | 1 |

Figure 14:
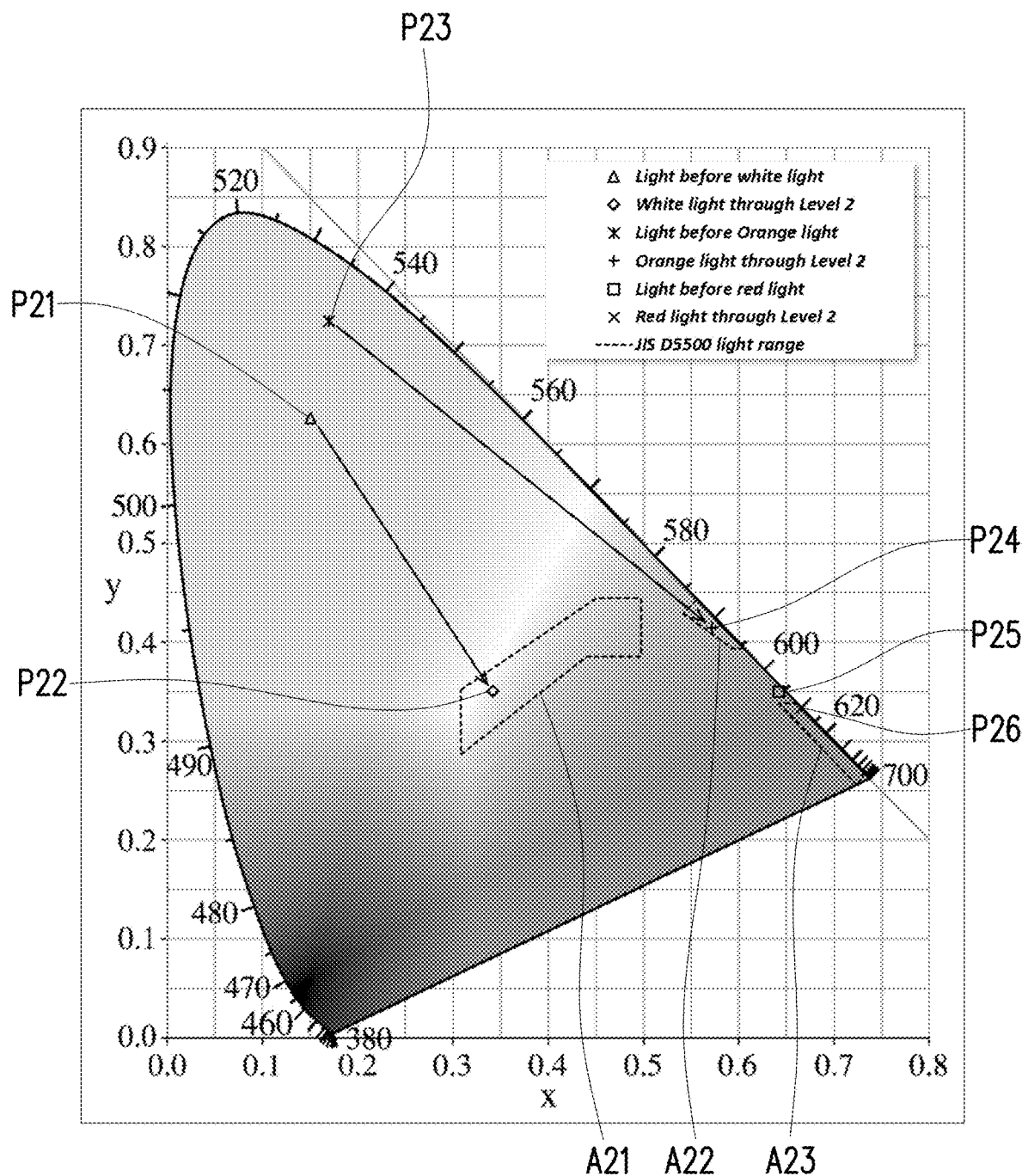
FIG. 14 is a chromaticity diagram of an embodiment in which the light-emitting device of FIG. 2 is applied to another vehicle lamp module.
Figure 15:
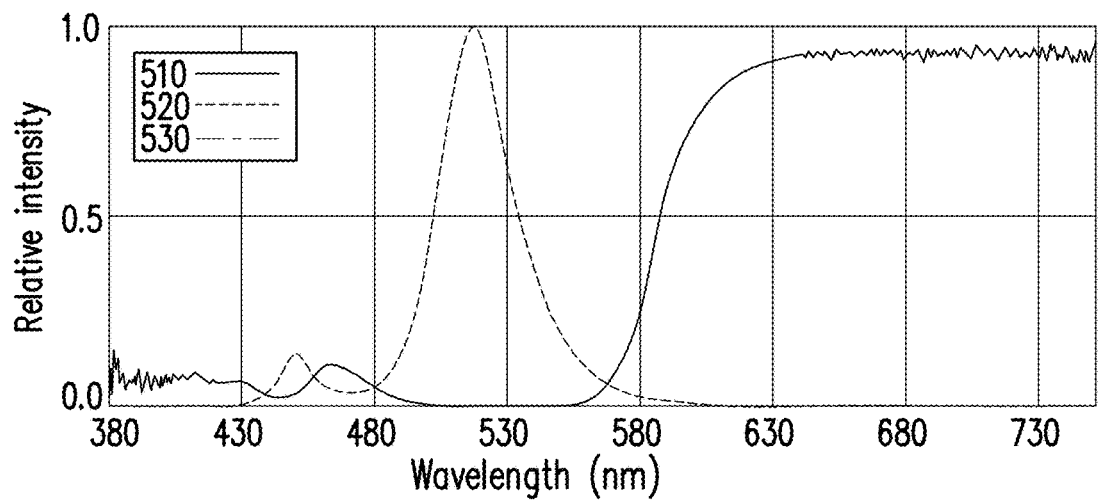
FIG. 15 is a spectral change diagram of white light formed by the internal light beam in the embodiment of FIG. 14 after passing through the red translucent protective shell.
Figure 16:
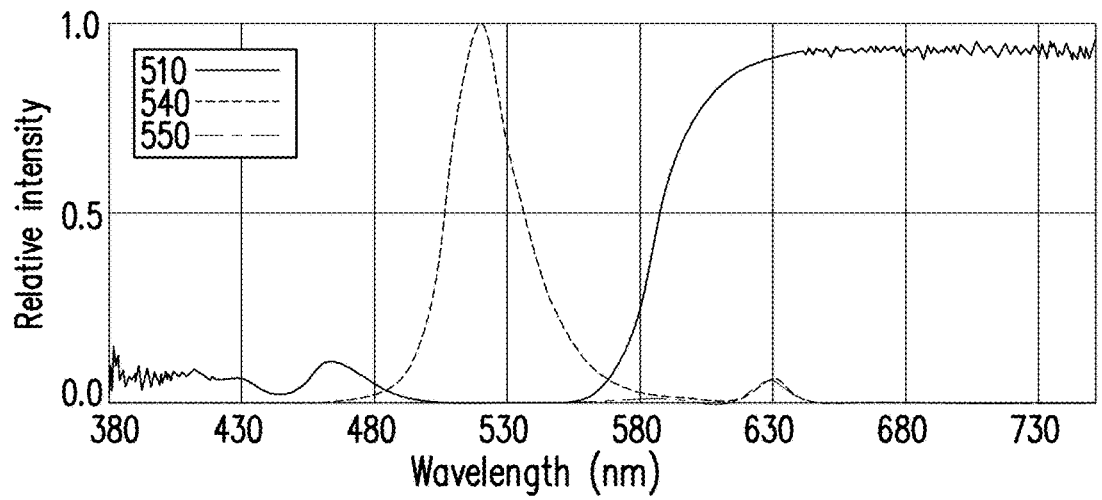
FIG. 16 is a spectral change diagram of orange light formed by the internal light beam in the embodiment of FIG. 14 after passing through the red translucent protective shell.
Figure 17:
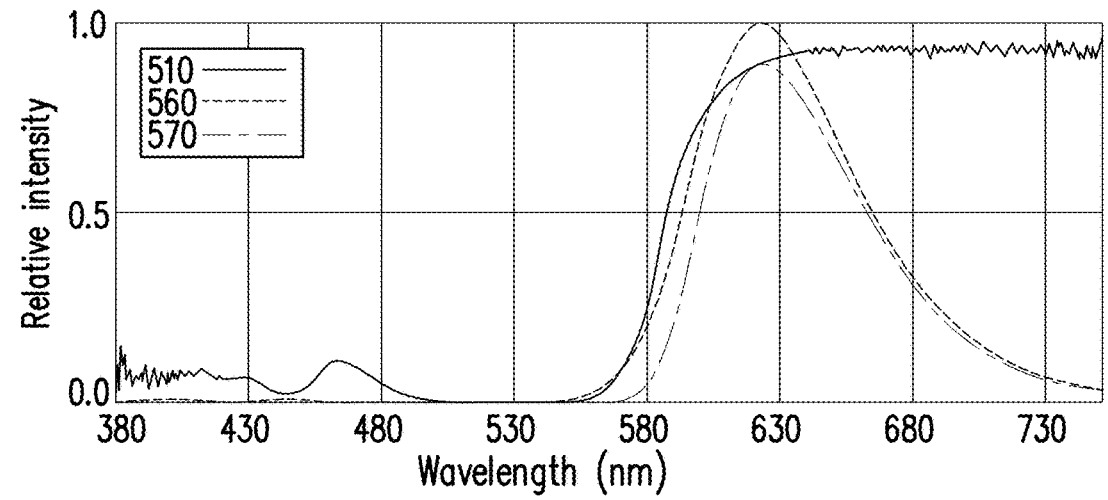
FIG. 17 is a spectral change diagram of red light formed by the internal light beam in the embodiment of FIG. 14 after passing through the red translucent protective shell.

FIG. 14 is a chromaticity diagram of an embodiment in which the light-emitting device of FIG. 2 is applied to another vehicle lamp module. FIG. 15 is a spectral change diagram of white light formed by the internal light beam in the embodiment of FIG. 14 after passing through the red translucent protective shell. FIG. 16 is a spectral change diagram of orange light formed by the internal light beam in the embodiment of FIG. 14 after passing through the red translucent protective shell. FIG. 17 is a spectral change diagram of red-orange light formed by the internal light beam in the embodiment of FIG. 14 after passing through the red translucent protective shell. Please first refer to FIG. 1, FIG. 2, FIG. 14, and FIG. 15. In FIG. 15, curve 510 represents the transmission spectrum of the red translucent protective cover 200, and curve 520 represents the spectrum of the internal light beam L1 provided by the light-emitting device 100, which corresponds to coordinate P21 in FIG. 10. Curve 530 represents the spectrum of the external light beam L2 after the internal light beam L1 passes through the red translucent protective shell 200, and corresponds to coordinate P22 in FIG. 14. This point falls within white block A21 of the vehicle regulations (JIS D5500). Therefore, when the white external light beam L2 in compliance with the vehicle regulations is to be provided, curve 520 may be calculated based on the data of curve 510 and curve 530 by means of simulation. Next, as shown in Table 4, the current ratio of the first light source 130, the second light source 140, and the third light source 150 is adjusted using the control element 300 to form a light source of curve 420. The difference from the embodiment in FIG. 10 is that in the vehicle lamp module 10 of the present embodiment, the thickness of the red translucent protective shell 200 is, for example, 0.3 cm.

Please refer to FIG. 1, FIG. 2, FIG. 14, and FIG. 16. In FIG. 16, curve 540 represents the spectrum of the internal light beam L1 provided by the light-emitting device 100, and corresponds to coordinate P23 in FIG. 14. Curve 550 represents the spectrum of the external light beam L2 after the internal light beam L1 passes through the red protective shell 200, and corresponds to coordinate P24 in FIG. 14. This point falls within orange block A22 of the vehicle regulations (JIS D5500). Similar to the above method of providing the external light beam L2 at coordinate P22, when the same red translucent protective shell 200 is used and the orange external light beam L2 in compliance with the vehicle regulations is to be provided, the spectrum of curve 540 may be obtained by calculating via the same method as described above, and as shown in Table 4, the current ratio of the first light source 130, the second light source 140, and the third light source 150 is adjusted using the control element 300 to form a light source of curve 540.

Please refer to FIG. 1, FIG. 2, FIG. 14, and FIG. 17. In FIG. 17, curve 560 represents the spectrum of the internal light beam L1 provided by the light-emitting device 100, and corresponds to coordinate P25 in FIG. 14. Curve 570 represents the spectrum of the external light beam L2 after the internal light beam L1 passes through the red translucent protective shell 200, and corresponds to coordinate P26 in FIG. 14. This point falls within red block A23 of the vehicle regulations (JIS D5500). Similar to the method of providing the external beam L2 of coordinate P22 described above, curve 560 may be obtained by calculating via the same method as described above, and as shown in Table 4, the current ratio of the first light source 130, the second light source 140, and the third light source 150 is adjusted using the control element 300 to form a light source of curve 460.

The detailed optical data and electrical data of the control output of the present embodiment may be seen in Table 3 and Table 4 below, respectively.

TABLE 3

| | Chromaticity x | Chromaticity y | Energy [W/nm] |
|---|---|---|---|
| Before passing through red translucent protective shell 200 | | | |
| P21 | 0.1510 | 0.6218 | 0.0208 |
| P23 | 0.1712 | 0.7191 | 0.0144 |
| P25 | 0.6453 | 0.3463 | 0.1898 |
| After passing through red translucent protective shell 200 | | | |
| P22 (white light) | 0.3437 | 0.3465 | 0.0005 |
| P24 (orange light) | 0.5746 | 0.4107 | 0.0006 |
| P26 (red light) | 0.6689 | 0.3303 | 0.1587 |
| Amount of change before and after passing through red translucent protective shell 200 | | | |
| | Chromaticity Δx | Chromaticity Δy | ΔEnergy [W/nm] |
| P21→P22 | 0.1927 | −0.2753 | 2.19% |
| P23→P24 | 0.4034 | −0.3084 | 4.23% |
| P25→P26 | 0.0236 | −0.016 | 83.65% |

TABLE 4

Light source current ratio distribution

| | First light source 130 (producing blue light) | Second light source 140 (producing green light) | Third light source 150 (producing red light after passing through phosphor) |
|---|---|---|---|
| P21 | 1.5 | 45 | 0 |
| P23 | 0 | 30 | 1 |
| P25 | 0 | 0 | 1 |

Figure 18:
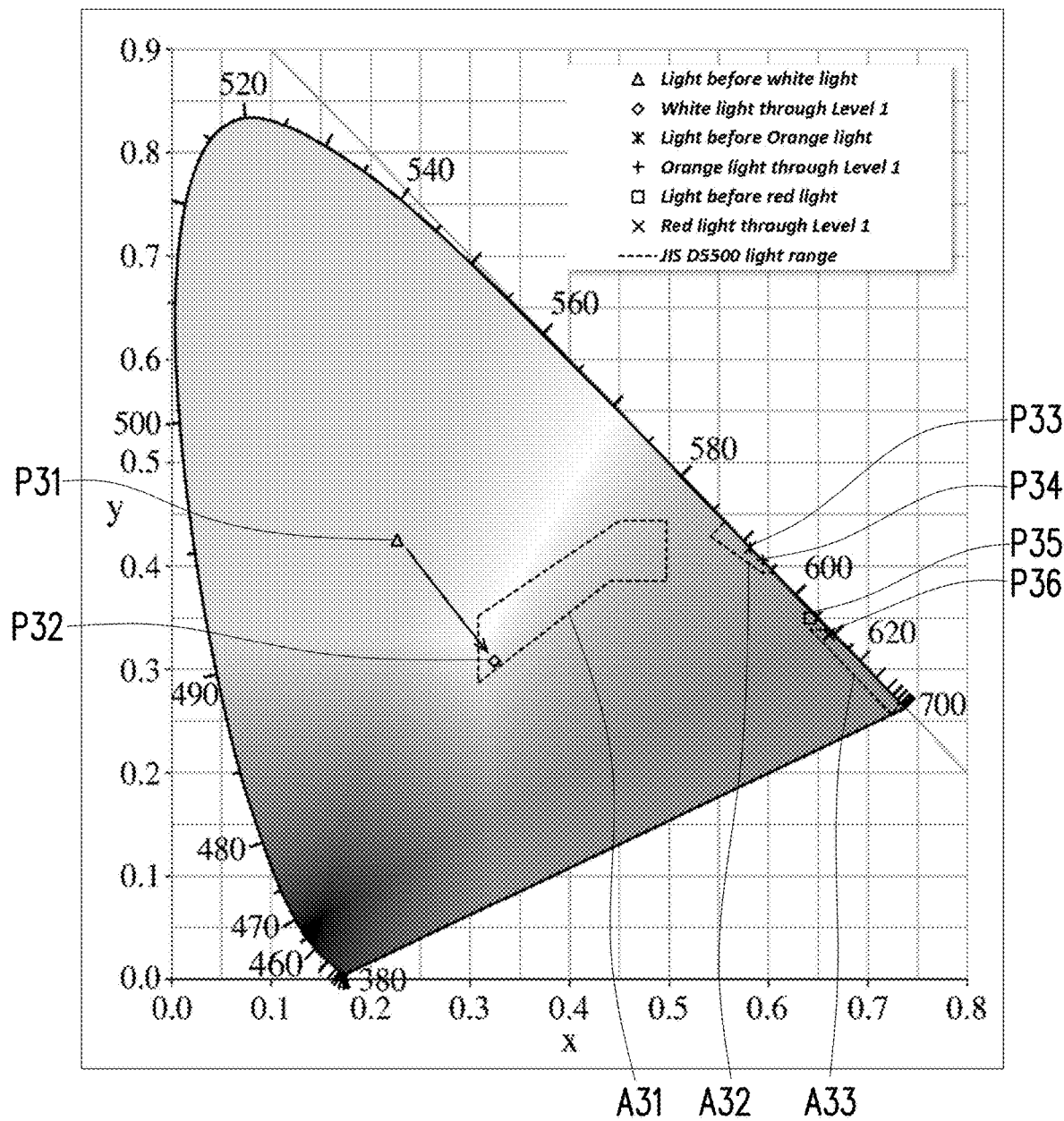
FIG. 18 is a chromaticity diagram of an embodiment in which the light-emitting device of FIG. 6 is applied to a vehicle lamp module.
Figure 19:
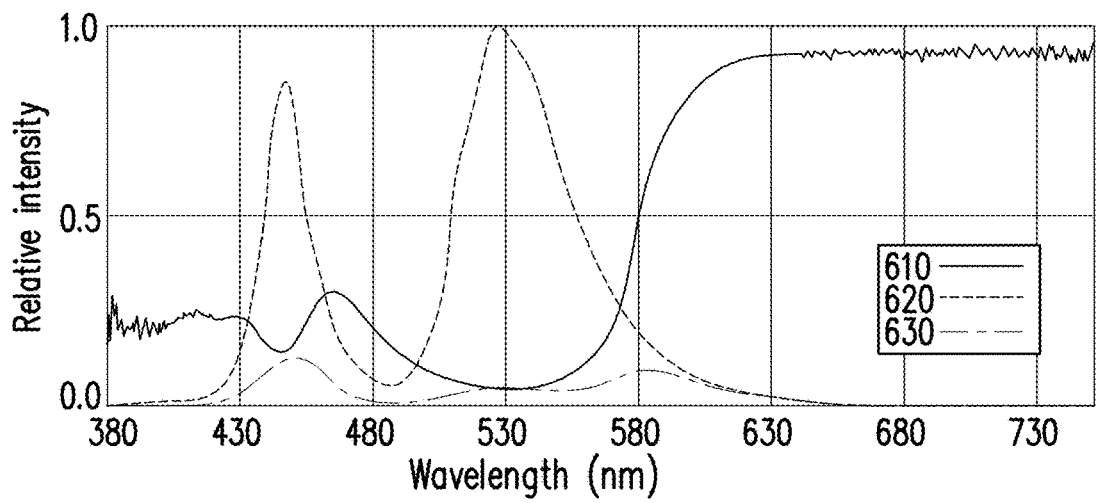
FIG. 19 is a spectral change diagram of white light formed by the internal light beam in the embodiment of FIG. 18 after passing through the red translucent protective shell.
Figure 20:
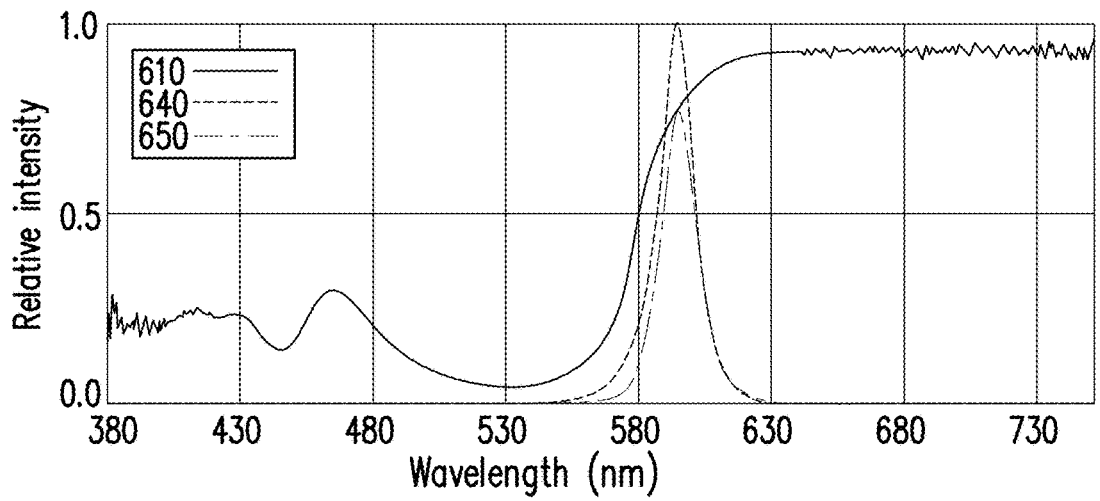
FIG. 20 is a spectral change diagram of orange light formed by the internal light beam in the embodiment of FIG. 18 after passing through the red translucent protective shell.
Figure 21:
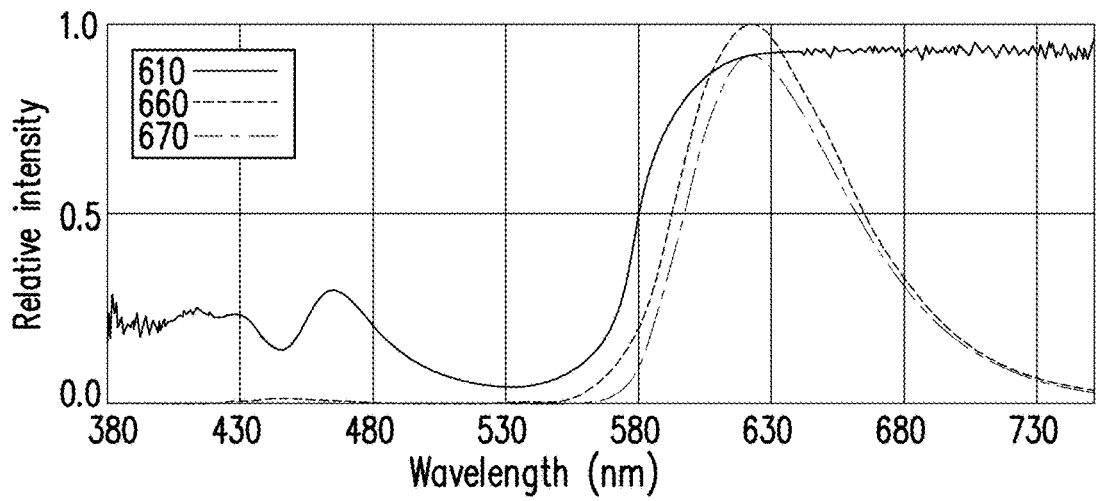
FIG. 21 is a spectral change diagram of orange light formed by the internal light beam in the embodiment of FIG. 18 after passing through the red translucent protective shell.

In an embodiment of the vehicle lamp module 10, the vehicle lamp module 10 includes the light-emitting device 100A shown in FIG. 6 and the red translucent protective shell 200, wherein the thickness of the red translucent protective shell 200 is exemplified as 0.2 cm, the first wavelength conversion material in the vehicle lamp module 10 is exemplified as $(Sr,Ca)SiAlN_3:Eu^{2+}$, and the second wavelength conversion material is exemplified as β-SiAlON. FIG. 18 is a chromaticity diagram of an embodiment in which the light-emitting device of FIG. 6 is applied to a vehicle lamp module. FIG. 19 is a spectral change diagram of white light formed by the internal light beam in the embodiment of FIG. 18 after passing through the red translucent protective shell. FIG. 20 is a spectral change diagram of orange light formed by the internal light beam in the embodiment of FIG. 18 after passing through the red translucent protective shell. FIG. 21 is a spectral change diagram of red light formed by the internal light beam in the embodiment of FIG. 18 after passing through the red translucent protective shell. Please first refer to FIG. 1, FIG. 6, FIG. 18, and FIG. 19. In FIG. 19, curve 610 represents the transmission spectrum of the red translucent protective cover 200, and curve 620 represents the spectrum of the internal light beam L1 provided by the light-emitting device 100A, which corresponds to coordinate P31 in FIG. 18. Curve 630 represents the spectrum of the external light beam L2 after the internal light beam L1 passes through the red translucent protective shell 200, and corresponds to coordinate P32 in FIG. 18. This point falls within white block A31 of the vehicle regulations (JIS D5500). Therefore, when the white external light beam L2 in compliance with the vehicle regulations is to be provided, curve 620 may be calculated based on the data of curve 610 and curve 630 by means of simulation. Next, as shown in Table 6, the current ratio of the first light source 130, the second light source 140A, and the third light source 150 is adjusted using the control element 300 to form a light source of curve 420.

Please refer to FIG. 1, FIG. 6, FIG. 18, and FIG. 20. In FIG. 20, curve 640 represents the spectrum of the internal light beam L1 provided by the light-emitting device 100A, and corresponds to coordinate P33 in FIG. 18. Curve 650 represents the spectrum of the external light beam L2 after the internal light beam L1 passes through the red protective shell 200, and corresponds to coordinate P34 in FIG. 18. This point falls within orange block A32 of the vehicle regulations (JIS D5500). Similar to the above method of providing the external light beam L2 at coordinate P32, when the same red translucent protective shell 200 is used and the orange external light beam L2 in compliance with the vehicle regulations is to be provided, the spectrum of curve 640 may be obtained by calculating via the same method as described above, and as shown in Table 6, the current ratio of the first light source 130, the second light source 140A, and the third light source 150 is adjusted using the control element 300 to form a light source of curve 640.

Please refer to FIG. 1, FIG. 6, FIG. 18, and FIG. 21. In FIG. 21, curve 660 represents the spectrum of the internal light beam L1 provided by the light-emitting device 100A, and corresponds to coordinate P35 in FIG. 18. Curve 670 represents the spectrum of the external light beam L2 after the internal light beam L1 passes through the red translucent protective shell 200, and corresponds to coordinate P36 in FIG. 18. This point falls within red block A33 of the vehicle regulations (JIS D5500). Similar to the method of providing the external beam L2 of coordinate P32 described above, curve 660 may be obtained by calculating via the same method as described above, and as shown in Table 6, the current ratio of the first light source 130, the second light source 140A, and the third light source 150 is adjusted using the control element 300 to form a light source of curve 660.

The detailed optical data and electrical data of the control output of the present embodiment may be seen in Table 5 and Table 6 below, respectively.

TABLE 5

| | Before passing through red translucent protective shell 200 | | |
|---|---|---|---|
| | Chromaticity x | Chromaticity y | Energy [W/nm] |
| P31 | 0.2282 | 0.4211 | 0.1187 |
| P33 | 0.5846 | 0.4142 | 0.2357 |
| P35 | 0.6453 | 0.3463 | 0.1898 |

| | After passing through red translucent protective shell 200 | | |
|---|---|---|---|
| | Chromaticity x | Chromaticity y | Energy [W/nm] |
| P32 (white light) | 0.3259 | 0.3042 | 0.0182 |
| P34 (orange light) | 0.5972 | 0.4020 | 0.1670 |
| P36 (red light) | 0.6643 | 0.3304 | 0.1650 |

TABLE 5-continued

| | Amount of change before and after passing through red translucent protective shell 200 | | |
|---|---|---|---|
| | Chromaticity Δx | Chromaticity Δy | ΔEnergy [W/nm] |
| P31→P32 | 0.0977 | −0.1169 | 15.33% |
| P33→P34 | 0.0126 | −0.0122 | 70.87% |
| P35→P36 | 0.0190 | −0.0159 | 86.97% |

TABLE 6

| | RGB output (control current) ratio distribution | | |
|---|---|---|---|
| | First light source 130 (producing yellow light) | Second light source 140A (producing green light after phosphor) | Third light source 150 (producing red light after phosphor) |
| P21 | 0 | 1 | 0 |
| P23 | 1 | 0 | 0 |
| P25 | 0 | 0 | 1 |

Figure 22:
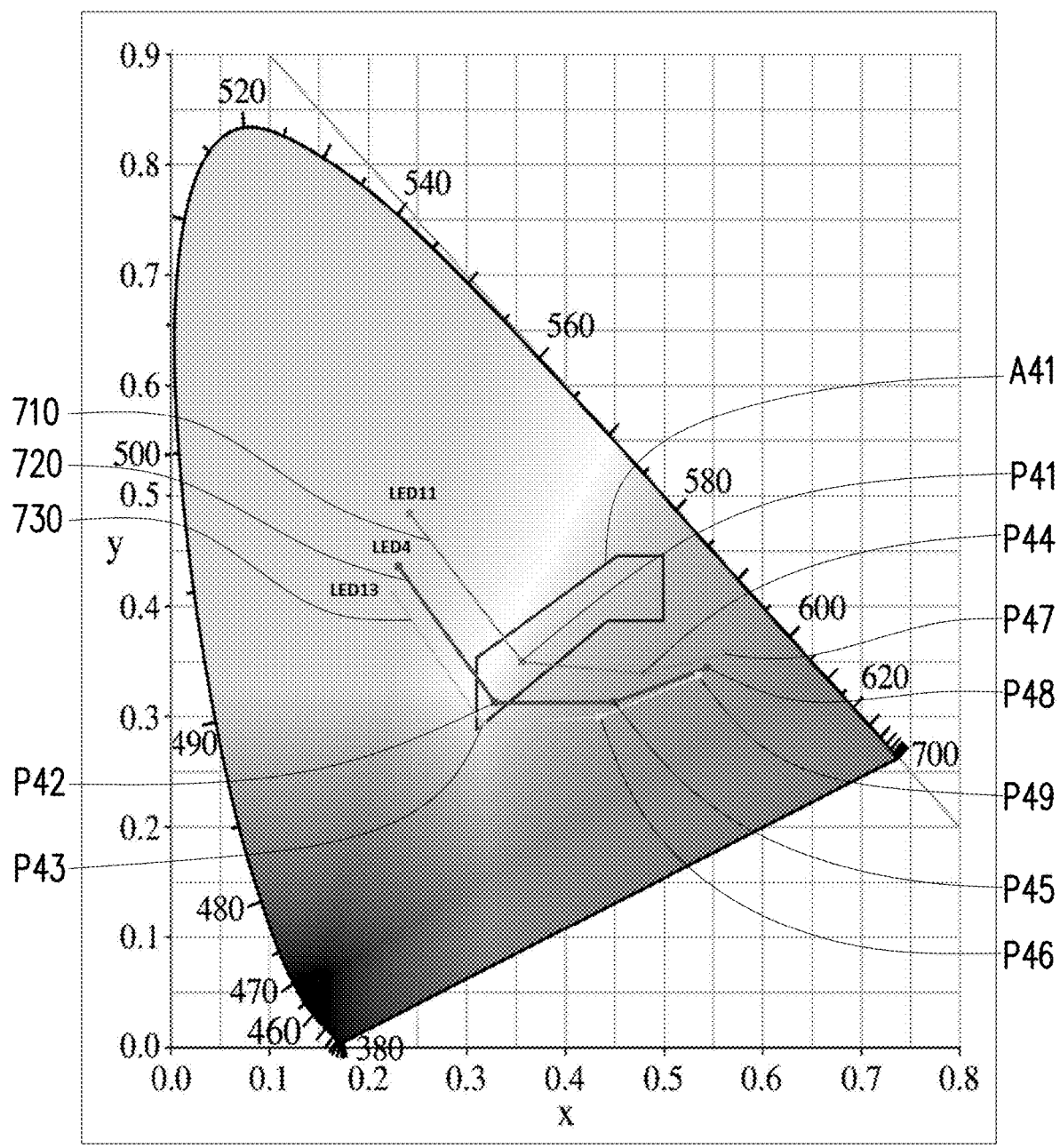
FIG. 22 is a chromaticity diagram of an embodiment in which the light-emitting device of FIG. 6 is applied to another vehicle lamp module.

FIG. 22 is a chromaticity diagram of an embodiment in which the light-emitting device of FIG. 6 is applied to another vehicle lamp module. Please refer to FIG. 1, FIG. 6, and FIG. 22. In the chromaticity diagram of FIG. 22, curves 710, 720, and 730 respectively represent different light-emitting devices 100A with different concentrations of the second wavelength conversion material (β-SiAlON) in the second portion 164, and the concentration of the second wavelength conversion material thereof is that curve 710 is greater than curve 720 that is greater than curve 730 in that order, and the position changes from coordinate P41 to coordinate P49 respectively indicate the before and after change of the internal light beam L1 into the external light beam L2 when different light-emitting devices 100A are applied to different car lamp modules 10 formed by red translucent protective shells 200 with a thickness of 0.2 cm (coordinate P41 to coordinate P43), 0.3 cm (coordinate P44 to coordinate P46), and 0.4 cm (coordinate P47 to coordinate P49). In particular, curve 710 approaches the addition limit of the green phosphor. It may be seen from the simulation results in FIG. 22 that no matter how the concentration of the green phosphor is changed, when the light-emitting device 100A of FIG. 6 is used in a thicker (for example, 0.3 cm or more) red translucent protective shell 200 (that is, coordinate P44 to coordinate P49), the external light beam L2 falling within white light block A41 of the vehicle regulations (JIS D5500) may not be formed. Since the green light intensity of the fifth light beam adjusted by the phosphor is lower or the color purity is insufficient, the fifth light beam is significantly filtered out by the red translucent protective shell 200. Moreover, when the red translucent protective shell 200 is thicker, the filtering effect is more significant. Therefore, after passing through a thicker red translucent protective shell 200, sufficient green light components may not be provided to be mixed with other light components to form white light. Therefore, compared with the light-emitting device 100 of FIG. 2, the light-emitting device 100A of FIG. 6 is less suitable for the red translucent protective shell 200 of various thicknesses.

Based on the above, in the light-emitting device and the vehicle lamp module of the invention, the frame of the light-emitting device includes an outer wall and a first partition to form at least two separate spaces. Therefore, via the light beam provided by the first light source, the light beam provided by the second light source, and the light beam provided by the third light source in combination with the second encapsulant containing the first wavelength conversion material, an internal light beam with mixed wavelengths may be formed and transmitted to the red translucent protective shell, and then pass through the red translucent protective shell to form a vehicle light beam in compliance with vehicle regulations. In this way, vehicle light beams of different wavelengths in compliance with vehicle regulations may be adjusted by the control of a control element, and the vehicle light beams of different wavelengths may be applied to red translucent protective shells of different thicknesses.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A vehicle lamp module, comprising:
   a light-emitting device configured to provide an internal light beam, the light-emitting device comprising:
   a substrate comprising a plurality of circuit pads and a resin portion connected to the plurality of circuit pads;
   a frame disposed on the substrate to form a first space, and the frame comprises an outer wall and a first partition located in the first space to form the first space as a second space and a third space spaced apart from each other;
   a first light source disposed at the second space and configured to provide a first light beam;
   a second light source disposed at the second space and configured to provide a second light beam;
   a third light source disposed at the third space and configured to provide a third light beam;
   a first encapsulant filled at the second space to seal the first light source and the second light source; and
   a second encapsulant filled at the third space to seal the third light source, wherein the second encapsulant comprises a first wavelength conversion material configured to convert the third light beam into a fourth light beam;
   a red translucent protective shell disposed on a transmission path of the internal light beam; and
   a control element electrically connected to the light-emitting device and configured to control a luminous intensity of the first light beam, the second light beam, and the third light beam, so that after at least one of the light beams passes through the red translucent protective shell, the vehicle lamp module emits an external light beam of a white light, an orange light, or a red light.

2. The vehicle lamp module of claim 1, wherein a height of the first partition is less than a height of the outer wall.

3. The vehicle lamp module of claim 1, wherein heights of the first encapsulant and the second encapsulant are respectively less than a height of the first partition.

4. The vehicle lamp module of claim 1, wherein the frame further comprises a fourth space therein overlapped with the first space in a light-emitting direction of the light-emitting device, the light-emitting device further comprises a third encapsulant filled in the fourth space.

5. The vehicle lamp module of claim 4, wherein the third encapsulant comprises a diffusing particle.

6. The vehicle lamp module of claim 4, wherein the third encapsulant is overlapped with the first encapsulant and the second encapsulant in a light-emitting direction of the light-emitting device.

7. The vehicle lamp module of claim 1, wherein the first light source and the third light source are blue light-emitting elements, and the second light source is a green light-emitting element.

8. The vehicle lamp module of claim 1, wherein the first light beam and the third light beam are blue light beams, the second light beam is a green light beam, and the fourth light beam is a red light beam or an orange light beam.

9. The vehicle lamp module of claim 1, wherein the frame further comprises a second partition connected to the first partition, and the second partition is located in the second space to form the second space as a fifth space and a sixth space spaced apart from each other, the first light source is disposed at the fifth space, and the second light source is disposed at the sixth space.

10. The vehicle lamp module of claim 9, wherein the first encapsulant comprises a first portion and a second portion, the first portion is filled at the fifth space to seal the first light source, and the second portion is filled at the sixth space to seal the second light source, wherein the second portion comprises a second wavelength conversion material configured to convert the second light beam into a fifth light beam.

11. The vehicle lamp module of claim 10, wherein the first light source, the second light source, and the third light source are all blue light-emitting elements.

12. The vehicle lamp module of claim 10, wherein the first light beam, the second light beam, and the third light beam are blue light beams, the fourth light beam is a red light beam or an orange light beam, and the fifth light beam is a green light beam.

13. The vehicle lamp module of claim 1, further comprising:
   a sensing element electrically connected to the control element, wherein the sensing element is configured to receive a temperature signal to provide an adjustment signal to the control element, and the control element adjusts the first light source, the second light source, and the third light source according to the adjustment signal.

* * * * *